US012761489B2

(12) United States Patent
Wang et al.

(10) Patent No.: US 12,761,489 B2
(45) Date of Patent: Oct. 13, 2026

(54) VIDEO HEADSETS WITH FLUID-BASED COOLING SYSTEMS AND RELATED METHODS

(71) Applicant: QUALCOMM Incorporated, San Diego, CA (US)

(72) Inventors: Peng Wang, San Diego, CA (US); Youmin Yu, Escondido, CA (US); Nader Nikfar, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 268 days.

(21) Appl. No.: 18/609,306

(22) Filed: Mar. 19, 2024

(65) Prior Publication Data

US 2025/0298251 A1 Sep. 25, 2025

(51) Int. Cl.
*H05K 7/20* (2006.01)
*G02B 27/01* (2006.01)
*G06F 1/20* (2006.01)

(52) U.S. Cl.
CPC ......... *G02B 27/0176* (2013.01); *G06F 1/206* (2013.01); *H05K 7/20145* (2013.01); *H05K 7/20154* (2013.01); *H05K 7/20327* (2013.01); *H05K 7/20381* (2013.01); *H05K 7/2099* (2013.01)

(58) Field of Classification Search
CPC ........................... G02B 27/0176; G06F 1/206; H05K 7/20145; H05K 7/20154; H05K 7/20327; H05K 7/20381; H05K 7/2099
USPC .......................................................... 361/700
See application file for complete search history.

(56) References Cited

U.S. PATENT DOCUMENTS 10,898,798 B2 * 1/2021 Chapman ................ A63F 13/50
11,036,054 B2 * 6/2021 Poore ................... G02B 27/017
11,058,026 B1 * 7/2021 Marić ..................... G06F 3/011
11,762,208 B1 * 9/2023 Dias ........................ G06F 1/206
345/8

(Continued)

FOREIGN PATENT DOCUMENTS

KR 102283470 B1 7/2021

OTHER PUBLICATIONS

International Search Report and Written Opinion for International Application No. PCT/US2025/018479, mailed May 28, 2025, 9 pages.

*Primary Examiner* — Zhengfu J Feng
(74) *Attorney, Agent, or Firm* — Withrow & Terranova, PLLC

(57) ABSTRACT

In a video headset, a video display inside an extended reality (XR) device is controlled by electronic circuits that generate heat while executing software applications for displaying content on the video display. The XR device includes heat dissipation technology to dissipate heat generated by the electronic circuits. The video headset includes a fluid-based cooling system comprising a closed loop conduit through which fluid moves from the XR device in the frontal portion of the harness to a thermal control mechanism in a rear portion of the harness, adjacent to the back of a user's head and then back to the XR device. In this regard, heat dissipation elements may be relocated from the XR device to the thermal control mechanism. to redirect heat to the rear portion, shift some of the noise and vibration to the rear portion and improve the weight distribution of the video headset.

20 Claims, 7 Drawing Sheets

(56) References Cited

U.S. PATENT DOCUMENTS

| | | | | |
|---|---|---|---|---|
| 2018/0052501 | A1 | 2/2018 | Jones, Jr. et al. | |
| 2024/0361085 | A1* | 10/2024 | Toleno .................. | F28F 21/006 |

* cited by examiner

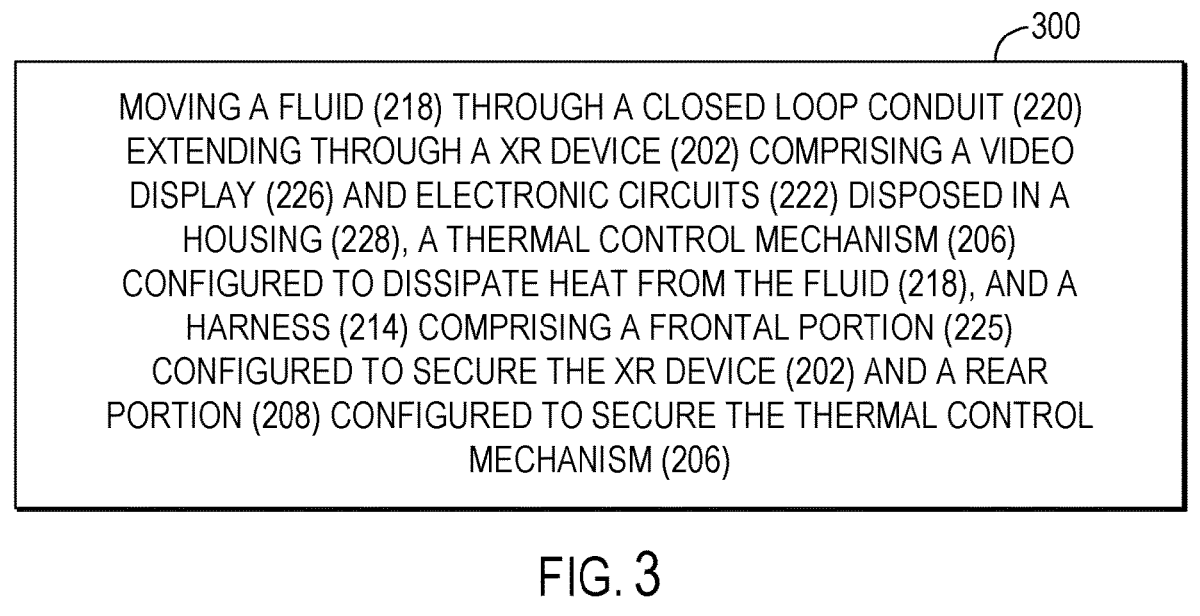

300

MOVING A FLUID (218) THROUGH A CLOSED LOOP CONDUIT (220) EXTENDING THROUGH A XR DEVICE (202) COMPRISING A VIDEO DISPLAY (226) AND ELECTRONIC CIRCUITS (222) DISPOSED IN A HOUSING (228), A THERMAL CONTROL MECHANISM (206) CONFIGURED TO DISSIPATE HEAT FROM THE FLUID (218), AND A HARNESS (214) COMPRISING A FRONTAL PORTION (225) CONFIGURED TO SECURE THE XR DEVICE (202) AND A REAR PORTION (208) CONFIGURED TO SECURE THE THERMAL CONTROL MECHANISM (206)

FIG. 3

VIDEO HEADSETS WITH FLUID-BASED COOLING SYSTEMS AND RELATED METHODS

TECHNICAL FIELD

The technology of the disclosure relates generally to thermal cooling of video headsets, including virtual reality headsets.

BACKGROUND

Video headsets provide an immersive video experience for a single user. A video headset is worn by a user to position an extended reality (XR) device, including one or more video displays in front of the user's eyes for viewing without visual interference from external sources. The video display may play selected video entertainment, such as movies and television or streamed series, but can also have the capability for interactive video games, virtual reality, or augmented reality applications. To provide such capability, electronic circuits, including at least one processor, are disposed inside the XR device to execute games and applications and control a high-resolution video display and audio speakers. A problem with packing so much processing power into the XR device of a video headset is that the video display and the electronic circuits that perform the video processing can generate a significant amount of heat. High heat may reduce the performance of the electronic circuits and make the XR device too hot to be comfortably worn by a user. Excessive heat can cause permanent damage to the hardware components (e.g., transistor circuits).

To address the issue of excessive heat generated in video headsets, passive and/or active heat dissipation devices and methods can be employed in the goggle assemblies of video headsets. As an example, heat sinks, heat pipes, and fans may be added to an XR device to remove heat generated by the electronic circuits and dissipate the heat to the environmental air around the XR device. However, because the XR device is on the face of a user, the heated air dissipated from the XR device can cause discomfort for the user, especially the user's forehead. In addition, the heat sinks and fans add weight to the XR device, further increasing user discomfort.

SUMMARY

Aspects disclosed in the detailed description include video headsets with a fluid-based cooling system. Related methods for employing fluid to cool a video headset are also disclosed. A video headset configured to be worn on the head of a user includes an extended reality (XR) device secured in a frontal portion of a harness and adjacent to the user's eyes. A video display inside the XR device is controlled by electronic circuits that generate heat while executing software applications for displaying content on the video display. The XR device includes heat dissipation technology to dissipate heat generated by the electronic circuits to avoid high temperatures in the electronic circuits and on surfaces of the XR device in contact with skin of the user. In an exemplary aspect, a video headset includes a fluid-based cooling system comprising a closed loop conduit through which fluid moves from the XR device in the frontal portion of the harness to a thermal control mechanism in a rear portion of the harness, adjacent to the back of a user's head and then back to the XR device. In this regard, heat dissipation elements may be relocated from the XR device to the thermal control mechanism to redirect at least some of the dissipated heat to the rear portion, shift some of the noise and vibration from the frontal portion to the rear portion, and also improve the weight distribution of the video headset on the head of the user. In some examples, the fluid moves in a circular direction away from the XR device through a first fluid channel on one side of the harness, through the thermal control mechanism, and back to the XR device through a second fluid channel on the other side of the harness. In some examples, more of the heat generated in the XR device is dissipated to the air from the thermal control mechanism than from the XR device.

In this regard, in one exemplary aspect, a video headset is disclosed. The video headset includes an XR device including a housing, a video display, and electronic circuits disposed in the housing, wherein the electronic circuits are configured to control the video display. The video headset further includes a thermal control mechanism, a harness configured to be worn by a user and comprising a frontal portion and a rear portion; and a fluid-based cooling system comprising a closed loop conduit extending through the XR device, the harness, and the thermal control mechanism. The XR device is secured in the frontal portion of the harness, and the thermal control mechanism is secured in the rear portion and configured to dissipate heat transferred from the XR device through the closed loop conduit.

In another exemplary aspect, a method of cooling a video headset is disclosed. The method includes moving a fluid through a closed loop conduit. The closed loop conduit extends through an XR device comprising a video display and electronic circuits disposed in a housing, a thermal control mechanism configured to dissipate heat from the fluid, and a harness comprising a frontal portion configured to secure the XR device and a rear portion configured to secure the thermal control mechanism.

In another exemplary aspect, a method in a video headset is disclosed. The method includes generating heat in electronic circuits in an XR device comprising a video display and securing the XR device on a frontal portion of a harness, and securing a thermal control mechanism on a rear portion of the harness. The method also includes moving a fluid in a closed loop conduit through the XR device, the harness, and the thermal control mechanism and dissipating, by the thermal control mechanism, heat from the fluid to environmental air adjacent to the thermal control mechanism.

BRIEF DESCRIPTION OF THE DRAWINGS

FIG. 3 is a flowchart of an exemplary method of cooling a video headset with a fluid-based cooling system, including a closed loop conduit that transfers fluid in between an XR device and a thermal control mechanism and back to the XR device to change a distribution of heat and weight on a front side of the user's head;

DETAILED DESCRIPTION

Figure 1B:
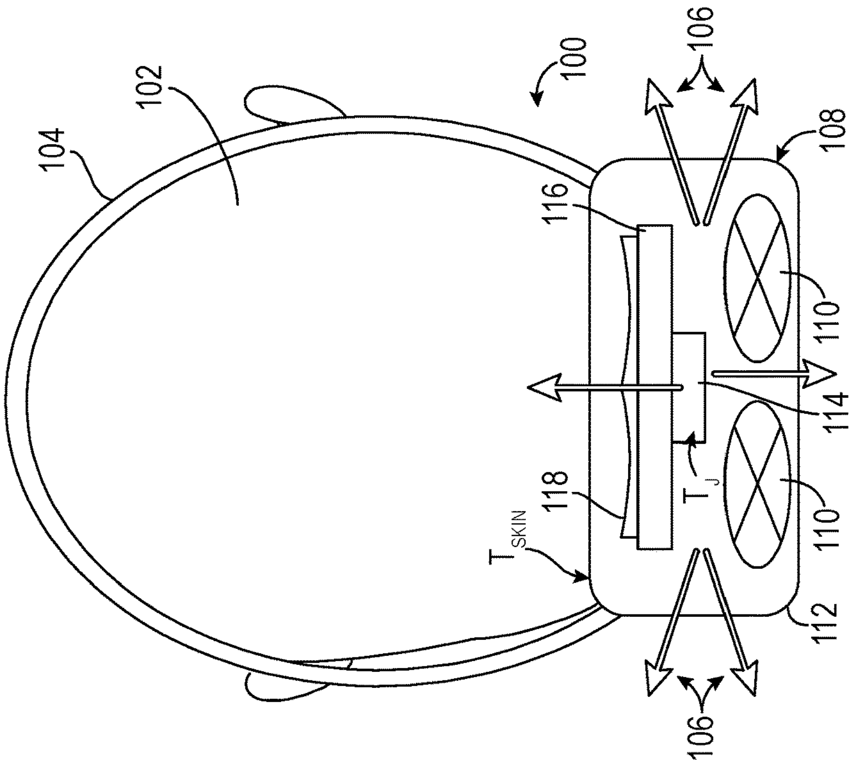
FIGS. 1A and 1B are a side view and a top view, respectively, showing an illustration of a conventional video headset, including an extended reality (XR) device secured over the eyes of a user by a harness and indicating directions in which heated air is dissipated from the XR device due to an active air-cooling system included in the XR device.

Several exemplary aspects of the present disclosure are described in reference to the drawing figures. The word "exemplary" is used herein to mean "serving as an example, instance, or illustration." Any aspect described herein as "exemplary" is not necessarily to be construed as preferred or advantageous over other aspects.

Aspects disclosed in the detailed description include video headsets with a fluid-based cooling system. Related methods for employing fluid to cool a video headset are also disclosed. A video headset configured to be worn on the head of a user includes an extended reality (XR) device secured in a frontal portion of a harness and adjacent to the user's eyes. A video display inside the XR device is controlled by electronic circuits that generate heat while executing software applications for displaying content on the video display. The XR device includes heat dissipation technology to dissipate heat generated by the electronic circuits to avoid high temperatures in the electronic circuits and on surfaces of the XR device in contact with the skin of the user. In an exemplary aspect, a video headset includes a fluid-based cooling system comprising a closed loop conduit through which fluid moves from the XR device in the frontal portion of the harness to a thermal control mechanism in a rear portion of the harness, adjacent to the back of a user's head and then back to the XR device. In this regard, heat dissipation elements may be relocated from the XR device to the thermal control mechanism to redirect at least some of the dissipated heat to the rear portion, shift some of the noise and vibration from the frontal portion to the rear portion, and also improve the weight distribution of the video headset on the head of the user. In some examples, the fluid moves in a circular direction away from the XR device through a first fluid channel on one side of the harness, through the thermal control mechanism, and back to the XR device through a second fluid channel on the other side of the harness. In some examples, more of the heat generated in the XR device is dissipated to the air from the thermal control mechanism than from the XR device.

Figure 1A:
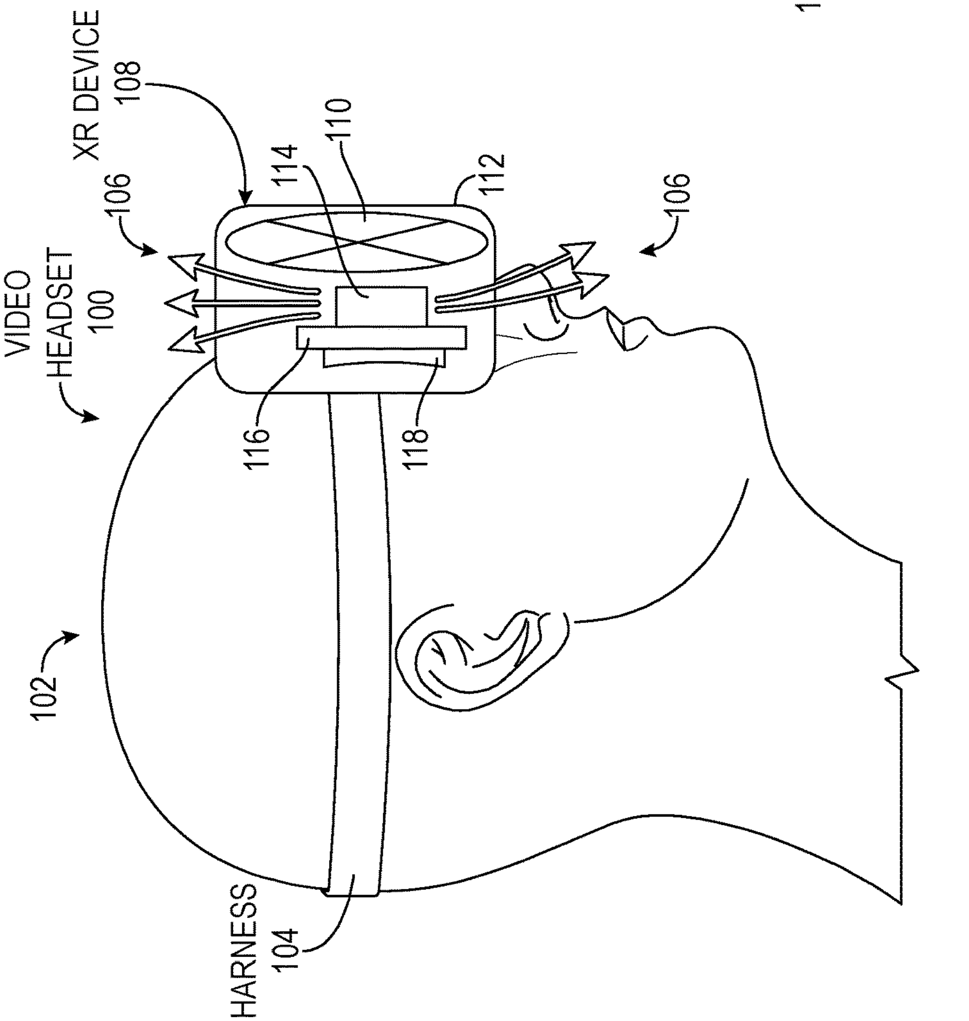

FIGS. 1A and 1B are a side view and a top view, respectively, showing a conventional video headset 100 secured in front of a head of a user 102 by a harness 104. Arrows 106 in FIGS. 1A and 1B indicate directions in which heated air may be dissipated (e.g., actively expelled) from an XR device 108 of the video headset 100 in response to the action of fans 110 (or other active air-moving devices) of an air-cooling system. The fans 110 may be positioned inside of or in an opening into a housing 112 of the XR device 108 to promote air flow.

The XR device 108 includes electronic circuits 114 mounted on a printed circuit board (PCB) 116 to control a video display 118 that is positioned in front of and viewed by the user 102. As the electronic circuits 114 operate, they generate heat that increases the temperature of the electronic circuits 114, the PCB 116, and the housing 112. The electronic circuits 114 may include processing circuits, memory circuits, and power management circuits, for example. Although not shown here, the cooling system may include heat dissipation elements such as heat sinks, heat pipes, and thermal interface materials (TIMs) to promote the conduction of heat away from the electronic circuits 114. The fans 110 are another form of heat dissipation element provided to increase air flow for convective cooling to reduce the buildup of heat in the XR device 108. Without the heat dissipation elements, the internally generated heat can cause temperatures of the video headset 100 to increase to levels at which the performance of the electronic circuits 114 may be affected or permanently damaged, as well as causing significant discomfort for the user 102.

For example, if a junction temperature $T_J$ of the electronic circuits 114 exceeds a first threshold temperature (e.g., 95° C.), device performance may be impacted and there may be permanent damage to the electronic circuits 114. Additionally, if a surface temperature $T_{SKIN}$ of the housing 112, which comes in contact with the user 102, exceeds a second temperature threshold (e.g., 45° C.), the video headset 100 may be too uncomfortable for the user 102 to wear.

In an effort to avoid higher temperatures inside the housing 112 of the XR device 108, the fans 110 force air from the environment outside the XR device 108 (e.g., environmental air) into the housing 112 and onto the electronic circuits 114, where the air is heated as it comes into contact with the electronic circuits 114 and any passive components used to dissipate the heat, such as a heat sink, heat pipe, etc. Forcing air into the XR device 108 raises the air pressure inside the XR device 108. Therefore, after the environmental air is blown onto the electronic circuits 114 and becomes heated, the heated air is forced out of the housing 112 through other openings.

The arrows 106 in FIGS. 1A and 1B show directions in which heated air may be forced out of the XR device 108. In this regard, all the heat dissipated from the electronic circuits 114 is forced out of the XR device 108 and may be blown onto the face and forehead of the user 102, which may also cause significant discomfort to the user 102, detracting from the user experience.

Additionally, as the fans 110 operate, in addition to any noise or vibration emitted by the fans 110 (e.g., the motors thereof), air movement through the XR device 108 may also cause noise or vibration. The noise and vibration caused by the fans 110 on the face of the user 102 may further detract from the experience of the user 102 of the video headset 100.

Furthermore, the addition of components of the cooling system, including the fans 110, as well as any internal passive components (not shown), such as heat sinks or heat pipes, increases the weight of the XR device 108 on the front of the head of the user 102. Stress on the neck of the user 102 caused by the additional weight may be another factor contributing to the overall discomfort of the user 102, detracting from the user experience. Accordingly, reducing the above sources of user discomfort would be desirable.

Figure 2B:
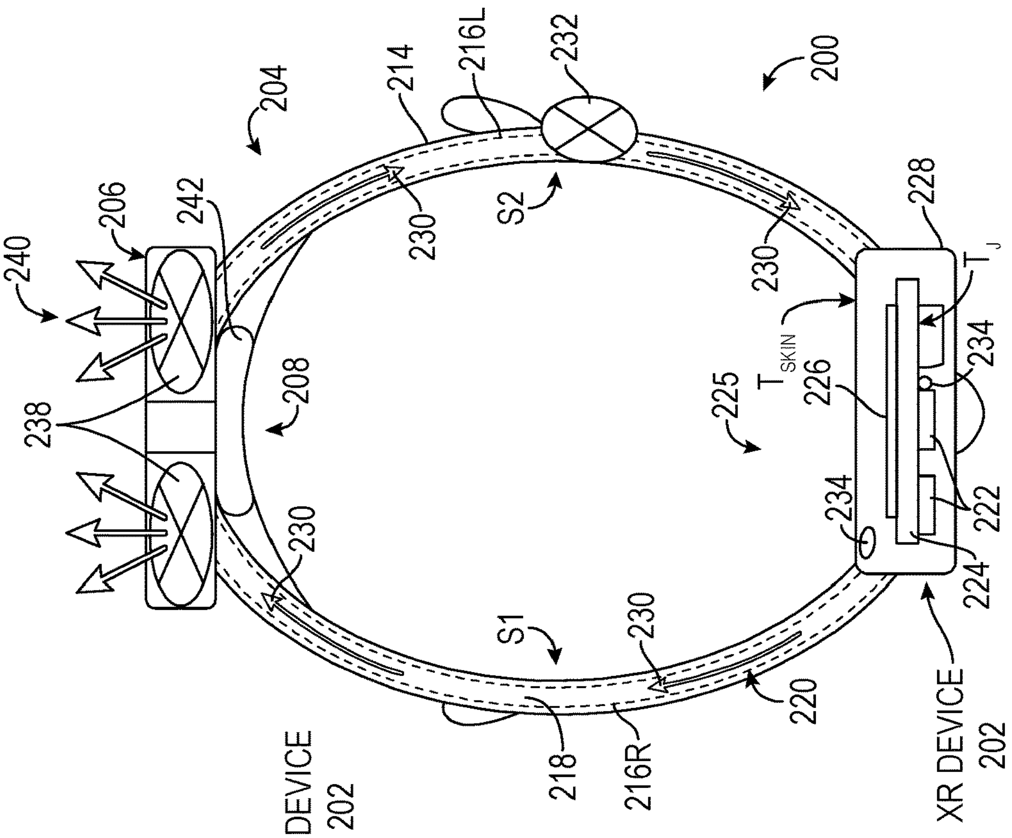
FIGS. 2A and 2B are a side view and a top view, respectively, showing an exemplary video headset including an XR device and a fluid-based cooling system including a closed loop conduit extending through a thermal control mechanism secured in a rear portion of the harness and fluid channels along sides of the harness for moving a fluid from the XR device to the thermal control mechanism and back to the XR device, and also indicating directions of heated air dissipated from the XR device and the thermal control mechanism.
Figure 2A:
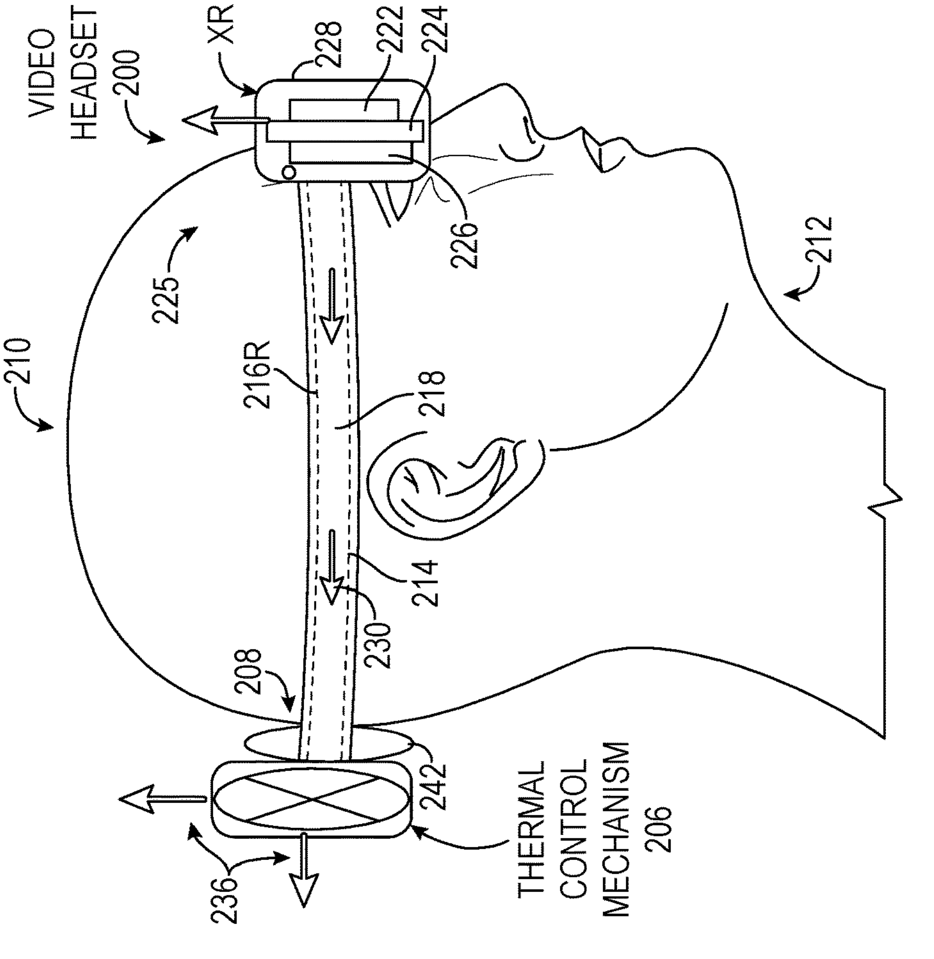

FIGS. 2A and 2B are a side view and a top view, respectively, showing an exemplary video headset 200 including an extended reality (XR) device 202 cooled by a fluid-based cooling system 204 including a thermal control mechanism 206 secured in a rear portion 208 of a harness 214. The fluid-based cooling system 204 includes a closed loop conduit 220 that includes fluid channels 216R and 216L for moving a fluid 218 from the XR device 202 to the thermal control mechanism 206, and back to the XR device 202. The term "closed loop conduit" refers to a sealed fluid path from which no fluid escapes or enters but rather flows, in this example, in a loop including the XR device 202, the fluid channel 216R, the thermal control mechanism 206, the fluid channel 216L, and back to the XR device 202. The thermal control mechanism 206 is configured to dissipate heat from the fluid 218. In some examples, the fluid 218 may be water or another appropriate substance that can be used in a liquid or gaseous state. Fluid 218, in an exemplary aspect, may be FLUORINERT or NOVEC sold by the 3M Company, 3M Center, Building 225-1S-23, Saint Paul, MN, 55144. Additional information about NOVEC can be found at https://www.3 m.com/3M/en_US/p/c/b/novec/ and about FLUORINERT at https://www.3 m.com/3M/en_US/p/d/b40045180/.

In the present disclosure, the term "XR device" may refer to an extended reality device and may also or alternatively refer to any of a virtual reality (VR) device, augmented reality (AR) device, or mixed reality (MR) device disposed in a headset corresponding to the headset 200 in FIG. 2. In this context, the term "headset" may refer to any one of a tethered headset connected to a computer or gaming console via cable(s), a standalone headset comprising a display, processor, and battery, a mobile headset that may rely on a smartphone or other device to provide a display and processing power, an MR headset that may include a camera, AR glasses, and industrial or enterprise headsets having ruggedized designs for professional use.

In this example, the XR device 202 includes electronic circuits 222 coupled to each other on a PCB 224. The electronic circuits 222 may include a processor, memory circuits, etc., that control the operation of a video display 226. The electronic circuits 222 and the video display 226 are disposed inside of a housing 228 of the XR device 202. The electronic circuits 222 and the video display 226 may both generate heat, causing a junction temperature $T_J$ of transistors (not shown) in the electronic circuits 222 to increase. The heat may also cause a skin temperature $T_{SKIN}$ of the housing 228 in contact with the user 212 to increase. To reduce and/or avoid an increase in these temperatures and thereby improve the user experience, the video headset 200 includes the fluid-based cooling system 204, explained in detail below.

The problems users experience when using conventional video headsets are addressed in the video headset 200, including moving at least some of the heat generated in the XR device 202 (e.g., by the electronic circuits 222) out of the XR device 202 before it is dissipated in a frontal region 225 of the harness 214 where the XR device 202 is located. Specifically, heat is transferred to the thermal control mechanism 206 through the closed loop conduit 220 by the fluid 218. By moving heat out of the XR device 202 in this manner, there is a reduction in the amount of heat that is dissipated directly from the XR device 202. Consequently, there is a reduction in the need for passive and active heat dissipation elements typically employed in an XR device. Instead, additional heat dissipation elements may be disposed in the thermal control mechanism 206 in the rear portion 208 of the harness 214.

The harness 214 secures the XR device 202 on the frontal portion 225 of the harness 214 and secures the thermal control mechanism 206 in the rear portion 208. In this regard, the XR device 202 may be adjacent to the eyes of a user and the thermal control mechanism 206 may be adjacent to the back of a user's head. The closed loop conduit 220 may be disposed in or on the harness 214 and includes the first fluid channel 216R and the second fluid channel 216L in which the fluid 218 may flow between the XR device 202 and the thermal control mechanism 206. The fluid-based cooling system 204 causes the fluid 218 to flow in the closed loop conduit 220 through the XR device 202, the harness 214, and the thermal control mechanism 206. As explained below with reference to FIG. 4, the fluid-based cooling system 204 includes a fluid-moving device (e.g., a pump) (not shown) in the thermal control mechanism 206. In some examples, the harness 214 may include thermal insulation to protect a head 210 of a user 212 from high temperature fluid 218.

A description of movement of the fluid 218 through the closed loop conduit 220 starting at the XR device 202, for example, is as follows. The fluid 218 is heated by heat from the electronic circuits 222 and the heated fluid 218 flows from the XR device 202 to the thermal control mechanism 206 by way of the first fluid channel 216R. The first fluid channel 216R extends between the XR device 202 and the thermal control mechanism 206 on a first side (right side) S1 of the harness 214. The thermal control mechanism 206 reduces the temperature of the fluid 218, which includes transferring or dissipating heat from the fluid 218 to the environmental air adjacent to the rear portion 208 of the harness 214. The cooled fluid 218 then passes through the second fluid channel 216L, which extends between the XR device 202 and the thermal control mechanism 206 on a second side (left side) S2 of harness 214, and back to the XR device 202. Thus, the fluid 218 may flow in a circular direction around the head 210 of the user 212, as indicated by the arrows 230. It should be understood that the direction of flow of the fluid 218 (seen as clockwise in FIG. 2B) may be in the reverse direction, such that the heated fluid 218 passes from the XR device 202 to the thermal control mechanism 206 by way of the fluid channel 216L and returns from the thermal control mechanism 206 to the XR device 202 by way of the fluid channel 216R. The thermal control mechanism 206 is discussed in more detail with reference to FIG. 4.

The video headset 200 may also include a valve 232, shown on the harness 214 in this example, for controlling a rate of fluid flow through the fluid channel 216L. Since the valve 232 is employed to control a rate of flow through the closed loop conduit 220, the valve 232 may alternatively be employed on the fluid channel 216R, as part of the thermal control mechanism 206, or in the XR device 202. The valve 232 may be fully opened to allow maximum rate of flow of the fluid 218, which may be desired in response to the junction temperature $T_J$ and/or the skin temperature $T_{SKIN}$ approaching or exceeding predetermined thresholds (e.g., 95° C. and 45° C., respectively). The valve 232 may be partially or fully closed to reduce flow rate of the fluid 218 in response to the junction temperature $T_J$ and/or the skin temperature $T_{SKIN}$ being lower than other predetermined thresholds. In this regard, the XR device 202 may include thermal sensors 234 (e.g., thermistors) for detecting the temperatures at various points within the XR device 202.

Signals generated by the thermal sensors 234 may be used to control the valve 232 based on at least one of the temperature (e.g., junction temperature $T_J$) of the electronic circuits 222 and a surface temperature (e.g., skin temperature $T_{SKIN}$) of the user 212. Temperatures other than the junction temperature $T_J$ and the skin temperature $T_{SKIN}$ may be detected by other thermal sensors 234 and used to control the valve 232 and other operations of the fluid-based cooling system 204. The signals generated by the thermal sensors 234 may be provided to the electronic circuits 222, for example, to control the valve 232.

As indicated, the rate of flow of the fluid 218 may be controlled to adjust an amount of the heat that is generated in the XR device 202 to reduce the temperatures therein. In this regard, the fluid-based cooling system 204 may cause more of the heat generated in the XR device 202 to be transferred to the thermal control mechanism 206 and dissipated to the environmental air (e.g., rear portion 208 of the head 210 of the user 212) from the thermal control mechanism 206 than is dissipated to the environmental air from the XR device 202 (e.g., to the environment). Arrows 236 indicate a direction of heated air dissipated from the thermal control mechanism 206, which may be caused by one or more active air-moving devices (e.g., electric fans) 238. Arrow 240 indicates a direction of air that may dissipate heat (e.g., by convection) from the XR device 202. In some examples, the XR device 202 does not include an active air-moving device. In some examples, a percentage of the heat that is dissipated to the air from the thermal control mechanism 206 may be configurable and may be controlled by a rate of flow of the fluid 218 (e.g., by the valve 232).

As an example, assuming the video headset 200 consumes energy (e.g., power), which is mostly converted to heat, at a rate of 20 watts, the fluid-based cooling system 204 may be configured to dissipate heat to the environmental air from the XR device 202 at a rate of 5 watts and dissipate heat to the environmental air from the thermal control mechanism 206 at a rate of 15 watts. In such example, the temperature of the thermal control mechanism 206 may increase, so the harness 214 may include a pad 242 separating the thermal control mechanism 206 from the head 210 of the user 212, to improve comfort. In some examples, the thermal control mechanism 206 and the XR device 202 may dissipate heat to the air at a same rate (e.g., 10 watts in the example of a total of 20 W power). In some examples, more of the heat generated in the XR device 202 may be dissipated to the air from the XR device 202 than is dissipated to the air from the thermal control mechanism 206. In some examples, there may be no flow of the fluid 218 based on the detected temperatures $T_J$ and $T_{SKIN}$ within the XR device 202, and all of the heat generated in the XR device 202 is dissipated to the air directly from the XR device 202.

The video headset 200 may communicate wirelessly (e.g., Bluetooth, Wi-Fi, or cellular) or by wire to receive applications, content, etc. to support video played on the video display 226 and audio played through speakers (not shown) disposed in the video headset 200. In this regard, the video headset 200 may include RF circuits for communication. The video headset 200 may be powered by one or more batteries and/or may be electrically coupled to a wired power source.

FIG. 3 is a flowchart of an exemplary method 300 for cooling a video headset 200 as shown in FIGS. 2A and 2B. The method includes moving a fluid 218 through a closed loop conduit 220 extending through an XR device 202 comprising a video display 226 and electronic circuits 222 disposed in a housing 228, a thermal control mechanism 206 configured to dissipate heat from the fluid 218, and a harness 214 comprising a frontal portion 225 configured to secure the XR device 202 and a rear portion 208 configured to secure the thermal control mechanism 206.

In some examples, a method in the video headset 200 may include generating heat in electronic circuits 222 in an XR device 202 comprising a video display 226; securing the XR device 202 on a frontal portion 225 of a harness 214 and securing a thermal control mechanism 206 on a rear portion 208 of the harness 214; moving a fluid 218 in a closed loop conduit 220 through the XR device 202, the harness 214, and the thermal control mechanism 206; and dissipating, by the thermal control mechanism 206, heat from the fluid 218 to the environmental air adjacent to the thermal control mechanism 206.

Figure 4:
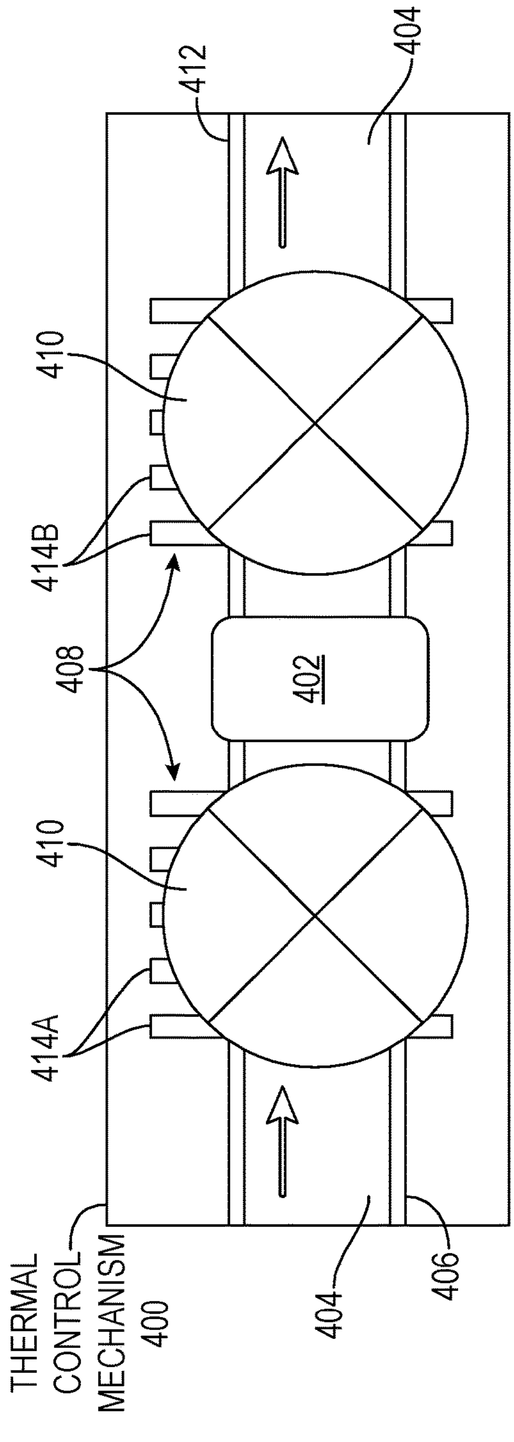
FIG. 4 is an illustration of a thermal control mechanism of the exemplary video headset in FIGS. 2A and 2B, including a device for moving fluid from the XR device to the thermal control mechanism through the closed loop conduit and a heat exchanger for extracting heat from the fluid, and also including an air-moving device (e.g., fan) for increasing the amount of airflow on the heat exchanger to dissipate heat to the environmental air.

FIG. 4 is an illustration of a thermal control mechanism 400, which may be the thermal control mechanism 206 of the video headset 200 shown in FIGS. 2A and 2B. The thermal control mechanism 400 includes a fluid-moving device (e.g., a pump) 402 that moves fluid 404 through a fluid channel 406 (e.g., from the XR device 202 in FIG. 2) to a heat exchanger 408 in the thermal control mechanism 400 to cool (extract heat from) the fluid 404. The heat exchanger 408 cools the fluid 404 by transferring heat from the fluid 404 to the environmental air around the thermal control mechanism 400. In this regard, the thermal control mechanism 400 also includes air-moving devices (e.g., fans) 410 configured to force air across the heat exchanger 408 to cool the heat exchanger 408 and increase the rate of cooling of the fluid 404. The fluid-moving device 402 may have an adjustable rate of flow and may be controlled to adjust the rate of flow based on temperatures detected in the XR device 202 of FIG. 2. Control of the fluid moving device 402 may be an alternative to or in addition to using the valve 232 in FIG. 2 for controlling a rate of fluid flow in the closed loop conduit 220.

The thermal control mechanism 400 is coupled to the fluid channel 406 to receive the fluid 404 that has been heated in the XR device of a video headset. The thermal control mechanism 400 is also coupled to another fluid channel 412 that allows the fluid 404 that has been cooled in the heat exchanger 408 to flow back to the XR device. In some examples, the fluid 404 flows in the direction from the fluid channel 412 to the fluid channel 406. In some examples, the fluid 404 may be drawn into the thermal control mechanism 400 by the fluid-moving device 402 by reducing a fluid pressure in the fluid channel 406. Additionally, or alternatively, as the fluid-moving device 402 pushes the fluid 404 through the fluid channel 412, which is included in the closed loop conduit 220, the fluid pressure of the fluid 404 increases, causing the fluid 404 to flow through the fluid channel 412 and away from the thermal control mechanism 400 to the XR device and pushing the fluid 404 in the fluid channel 406 into the heat exchanger 408.

In some examples, the reduction in fluid pressure in the fluid channel 406 creates a situation in which the heated fluid 404 may change phase from a liquid to a gas or vapor (e.g., by evaporation). Heating of the fluid 404 in an XR device may also cause the phase change from liquid to gas. As the fluid 404 passes through the heat exchanger 408, in which the fluid 404 is cooled, and into the fluid-moving device 402, in which the fluid pressure is increased, the fluid 404 may change phase back (e.g., by condensation) from a gas to a liquid. Thus, the thermal control mechanism 400 may be employed in a fluid-based cooling system, such as the fluid-based cooling system 204 in FIG. 2, also referred to as a two-phase cooling system.

The heat exchanger 408 includes at least one fin, but in this example includes two sets of fins 414A and 414B in contact with the fluid 404, where the set of fins 414A in this example is positioned before the fluid-moving device 402 in the direction of flow through the thermal control mechanism 400 and the set of fins 414B is positioned after the fluid-moving device 402 in the direction of flow. The fins 414A and 414B may be formed of a thermally conductive material, such as a metal, that is heated by being in contact with the fluid 404 within the fluid channels 406 and 412 and the heat exchanger 408. The fins 414A and 414B also extend outside the fluid channels 406 and 412 in contact with the environmental air adjacent to the head of the user, where the air-moving devices 410 force air across the fins 414A and 414B to increase a rate at which they are cooled. The heat exchanger 408 in the thermal control mechanism 400 is included in the closed loop conduit 220 in FIG. 2.

Figure 5:
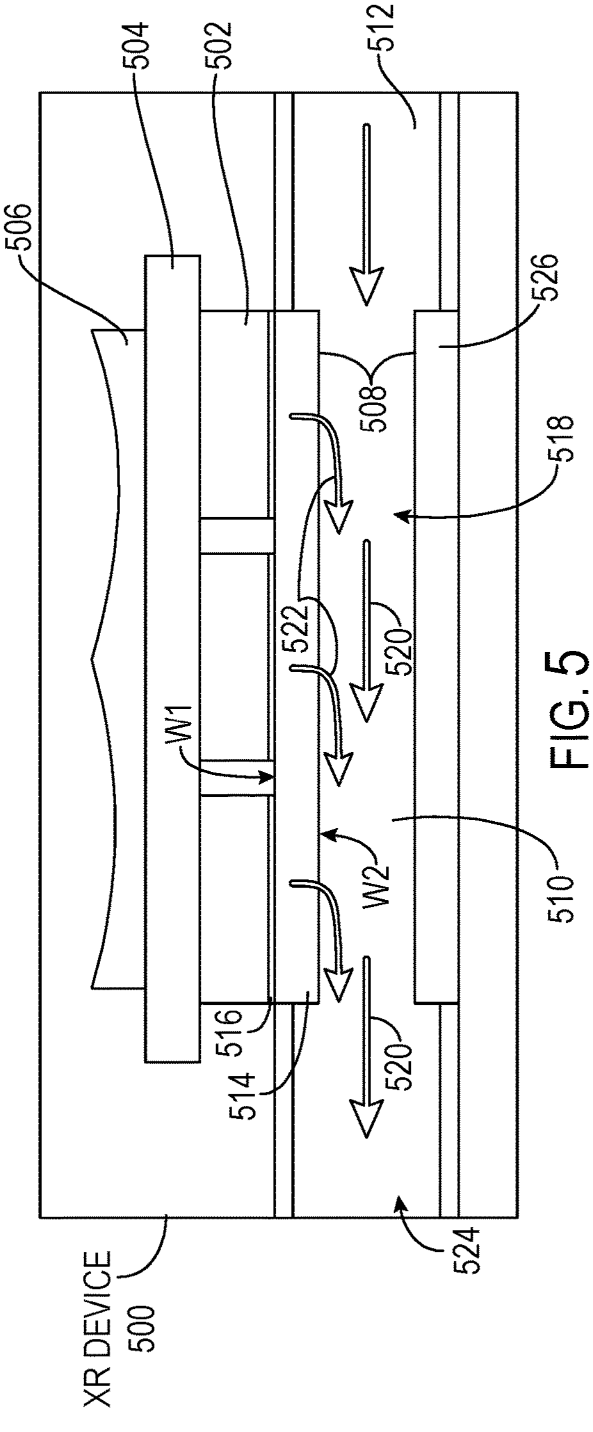
FIG. 5 is an illustration of the electronic circuits in the XR device of the exemplary video headset in FIGS. 2A and 2B thermally coupled to a heat exchanger through which cool fluid flows in and heated fluid exits to transfer heat away from the XR device.

FIG. 5 is an illustration of an XR device 500 that may be the XR device 202 in FIG. 2. The XR device 500 includes electronic circuits 502 on a PCB 504 and a video display 506. The electronic circuits 502 are thermally coupled to a heat exchanger 508 through which fluid 510 enters from a fluid channel 512 at a lower temperature. The heat exchanger 508 in this example may be referred to as a cold plate or a heat sink having one wall 514 (e.g., a planar wall) that is thermally coupled to the electronic circuits 502. A thermal interface material (TIM) 516 may be provided between the electronic circuits 502 and the wall 514 to improve the thermal conductivity of the heat generated in the electronic circuits 502 to a first side W1 of the wall 514. The heat exchanger 508, including the wall 514, may be formed of a thermally conductive material such that heat entering the first side W1 of the wall 514 is conducted to a second side W2 of the wall 514. The second side W2 of the wall 514 is inside a chamber 518 in the heat exchanger 508. Fluid 510, which has been cooled in a thermal control mechanism, such as the thermal control mechanism 400 in FIG. 4, flows from the fluid channel 512 into the chamber 518 of the heat exchanger 508 and comes into contact with the second side W2 of the wall 514 where the fluid 510 is heated. Arrows 520 indicate a direction of flow of the fluid 510 and arrows 522 indicate a direction of flow of heat through the wall 514 and into the fluid 510. The fluid 510 that has been heated exits the chamber 518 through a fluid channel 524 to transfer heat away from the XR device 500 to be dissipated in the thermal control mechanism 400. The heat exchanger 508 includes a second wall 526 forming a second side of the chamber 518. The heat conducted to the wall 514 may be further conducted to the second wall 526 and then transferred to the fluid 510. The heat exchanger 508 and in particular the chamber 518 are included in the closed loop conduit 220 in FIG. 2.

Referring back to FIGS. 2 and 4, including the thermal control mechanism 206, 400 in a video headset, such as the video headset 200 in FIG. 2, may reduce the amount of heat that is dissipated to the environmental air from the XR device 202. As discussed above, the percentage of heat generated in the XR device 202 that is actually dissipated to the environmental air from the thermal control mechanism 206, 400 may be configurable. In some examples, the thermal control mechanism 206 may dissipate most of the heat near the rear portion 208 of the harness, which is near the back of the head 210 of the user 212. Therefore, the cooling capacity of the XR device 202 may be reduced. In this regard, the size, number, and/or capacity of heat-dissipating elements (e.g., hardware) such as heat sinks, heat pipes, and air-moving devices employed in the XR device 202 may be reduced to reduce product costs. In some examples, the XR device 202 does not include an active air-moving device.

A reduction in the number, size, etc., of air-moving devices in the XR device 202 may also reduce the noise and vibration compared to the larger air-moving devices employed in goggle assemblies of conventional video headsets that are entirely responsible for thermal management of a video headset. Such reductions in heat-dissipating elements may also reduce a weight of the XR device 202 in the frontal portion 225 of the harness 214, reducing the weight on the front of the head 210 of the user 212 while including the thermal control mechanism 206 increases the weight in the rear portion 208 on the back of the head 210 of the user 212. Thus, the exemplary video headset 200 in FIG. 2 is more balanced (front to back) on the head 210 of the user 212, which improves comfort and reduces fatigue of the user 212.

Figure 6B:
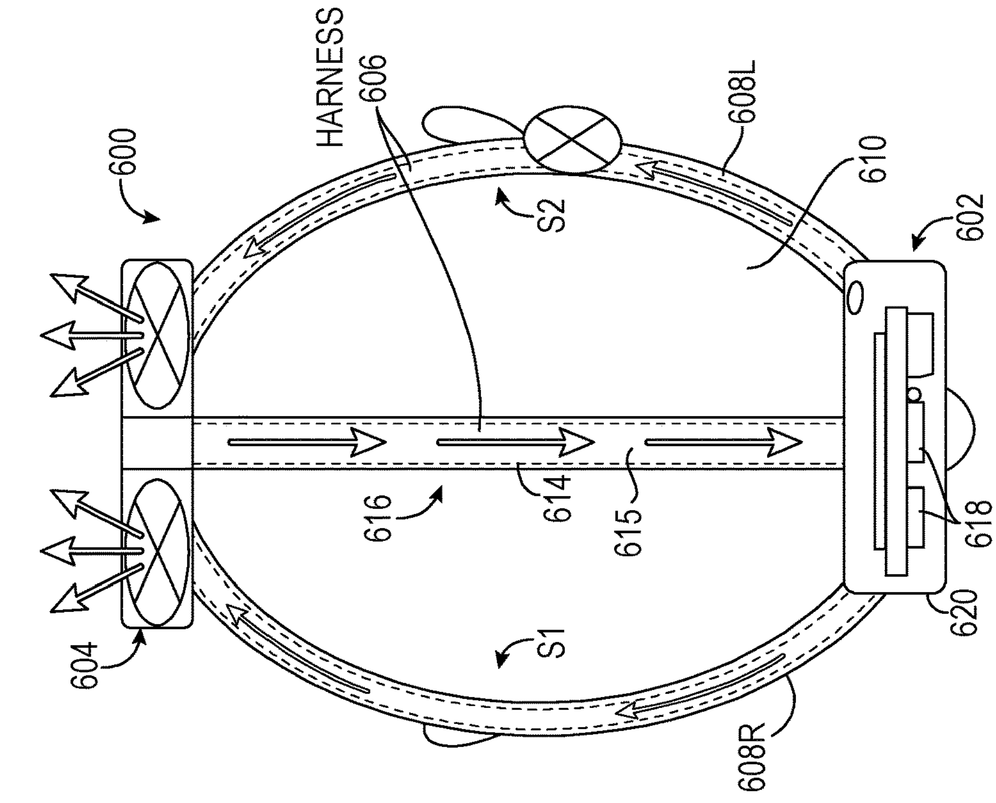
FIGS. 6A and 6B are a side view and a top view, respectively, showing a second example of an exemplary video headset including an XR device and a thermal control mechanism fluidly coupled by a closed loop conduit including a first fluid channel on a first side of harness, a second fluid channel on a second side of the harness, and a third fluid channel that passes between the first side and the second side of the harness from the thermal control mechanism to the XR device to increase a total rate of flow of the fluid through the XR device for improved cooling.
Figure 6A:
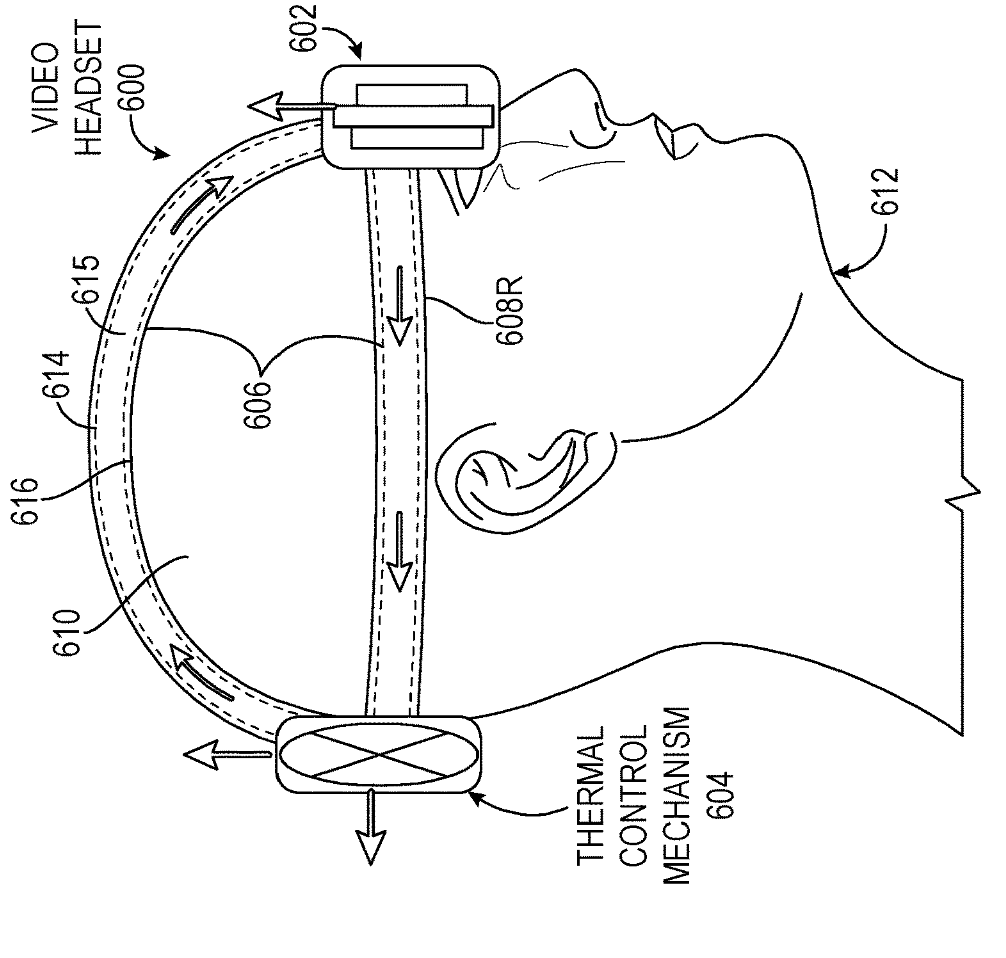

FIGS. 6A and 6B are a side view and a top view, respectively, showing a second example of an exemplary video headset 600 including an XR device 602 and a thermal control mechanism 604 coupled to each other by a harness 606 including a first fluid channel 608R on a first side S1 of the harness 606, a second fluid channel 608L on a second side S2 of the harness 606, and a third fluid channel 614 that extends between the XR device 602 and the thermal control mechanism 604 and passes between the first side S1 and the second side S2 (over the top 616 of the head 610 of the user 612). In other aspects, the video headset 600 corresponds to the features of the video headset 200 in FIGS. 2A and 2B. The third fluid channel 614 may be incorporated into a closed loop conduit like the closed loop conduit 220. The XR device 602 includes electronic circuits 618 that generate heat that can raise the temperature of the electronic circuits 618 and the surface temperature of a housing 620 of the XR device 602 that comes into contact with the head 610 of the user 612.

Including a third fluid channel 614 may increase a total rate of flow of the fluid through the XR device 602 for improved cooling. In some examples, the third fluid channel 614 transfers fluid 615 that is heated in the XR device 602 to the thermal control mechanism 604, and the first and second fluid channels 608R and 608L transfer fluid 615 cooled in the thermal control mechanism 604 back to the XR device 602. In some examples, the first and second fluid channels 608R and 608L transfer fluid 615 that is heated in the XR device 602 to the thermal control mechanism 604, and the third fluid channel 614 transfers fluid 615 cooled in the thermal control mechanism 604 back to the XR device 602.

In some examples not shown, the first and second fluid channels 608R and 608L may be eliminated from the first and second sides S1 and S2 of the harness 606, and the third fluid channel 614 may instead be two fluid channels forming a closed loop conduit, where one fluid channel transfers heated fluid 615 from the XR device 602 to the thermal control mechanism 604 and the other transfers cooled fluid 615 from the thermal control mechanism 604 to the XR device 602. Other fluid channel configurations may be employed to form a closed loop conduit for a fluid-based cooling system of a video headset, as disclosed herein.

Electronic devices, including electronic circuits according to any aspects disclosed herein, may be provided in or integrated into any processor-based device, including a video headset as described above. Other examples, without limitation, include a set-top box, an entertainment unit, a navigation device, a communications device, a fixed location data unit, a mobile location data unit, a global positioning system (GPS) device, a mobile phone, a cellular phone, a smartphone, a session initiation protocol (SIP) phone, a tablet, a phablet, a server, a computer, a portable computer, a mobile computing device, laptop computer, a wearable computing device (e.g., a smartwatch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, an avionics system, a drone, and a multicopter.

Figure 7:
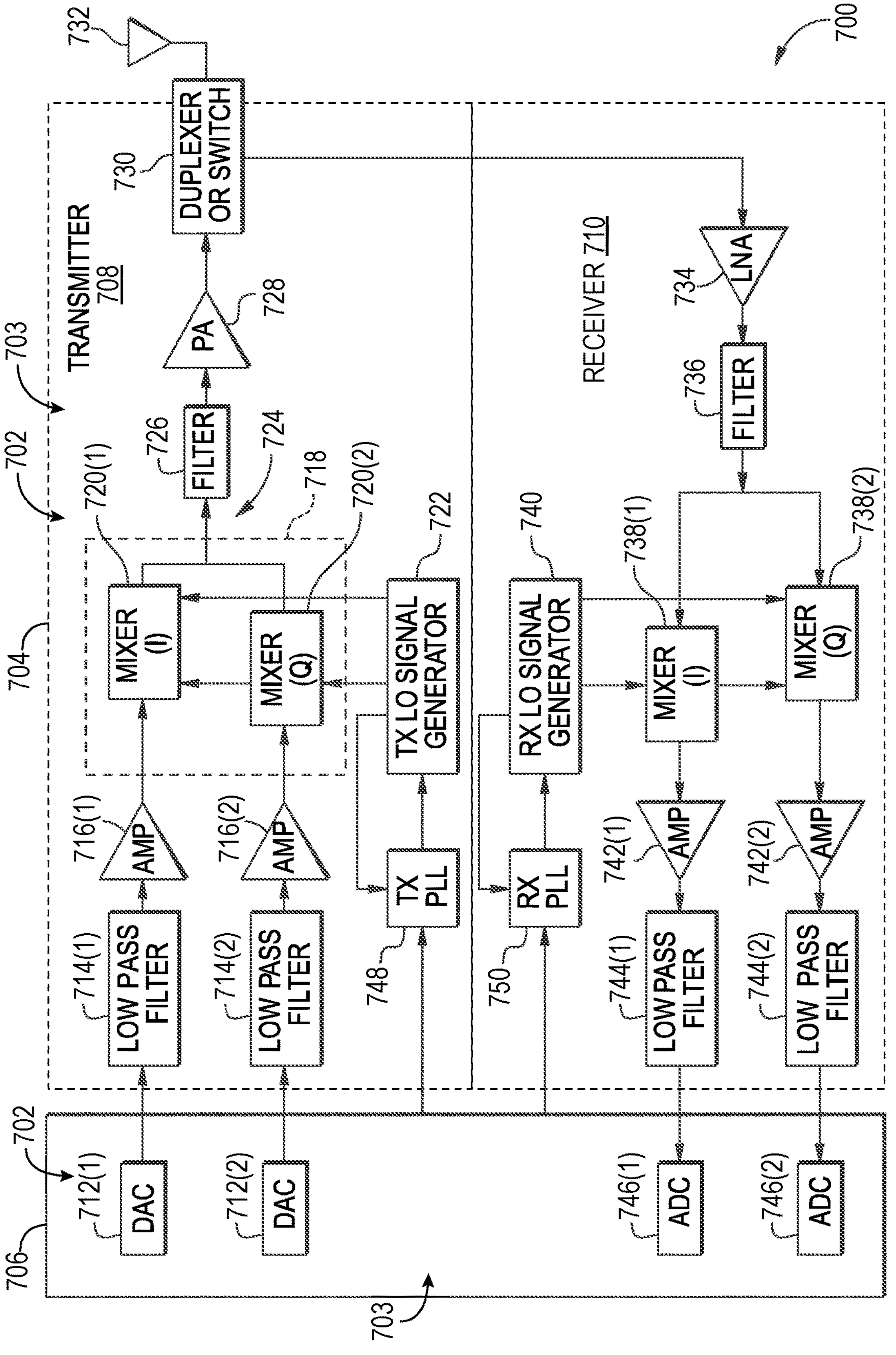
FIG. 7 is a block diagram of an exemplary transistor circuit on an exemplary integrated circuit (IC) die that may be included in a video headset, including an XR device secured to a frontal portion of a harness and cooled by a fluid-based cooling system including a thermal control mechanism secured in a rear portion of the harness, as illustrated in FIGS. 2A, 2B, 6A, and 6B that may operate according to, but not limited to, the exemplary method of cooling in the flowchart in FIG. 3.

In this regard, FIG. 7 illustrates a block diagram of an exemplary wireless communications device 700 that includes radio frequency (RF) components formed from one or more ICs 702, wherein the communications device 700 may be included in the video headsets 200 and 600 in FIGS. 2A, 2B, 6A, and 6B, which include a fluid-based cooling system 204 configured to cause a fluid 218 to flow through an XR device 202, a thermal control mechanism 206, and a harness 214 in a closed loop. The wireless communications device 700 may be included in any of the above-referenced video headsets for the purpose of Bluetooth, Wi-Fi or cellular communication, for example. As shown in FIG. 7, the wireless communications device 700 includes a transceiver 704 and a data processor 706. The data processor 706 may include a memory to store data and program codes. The transceiver 704 includes a transmitter 708 and a receiver 710, which support bi-directional communications. In general, the wireless communications device 700 may include any number of transmitters 708 and/or receivers 710 for any number of communication systems and frequency bands. All or a portion of the transceiver 704 may be implemented on one or more analog ICs, RF ICs (RFICs), mixed-signal ICs, etc.

The transmitter 708 or the receiver 710 may be implemented with a super-heterodyne or direct-conversion architecture. In the super-heterodyne architecture, a signal is frequency-converted between RF and baseband in multiple stages, e.g., from RF to an intermediate frequency (IF) in one stage and then from IF to baseband in another stage. In the direct-conversion architecture, a signal is frequency-converted between RF and baseband in one stage. The super-heterodyne and direct-conversion architectures may use different circuit blocks and/or have different requirements. In the wireless communications device 700 in FIG. 7, the transmitter 708 and the receiver 710 are implemented with the direct-conversion architecture.

In the transmit path, the data processor 706 processes data to be transmitted and provides I and Q analog output signals to the transmitter 708. In the exemplary wireless communications device 700, the data processor 706 includes digital-to-analog converters (DACs) 712(1), 712(2) for converting digital signals generated by the data processor 706 into I and Q analog output signals, e.g., I and Q output currents, for further processing.

Within the transmitter 708, lowpass filters 714(1), 714(2) filter the I and Q analog output signals, respectively, to remove undesired signals caused by the prior digital-to-analog conversion. Amplifiers (AMPs) 716(1), 716(2) amplify the signals from the lowpass filters 714(1), 714(2), respectively, and provide I and Q baseband signals. An upconverter 718 upconverts the I and Q baseband signals with I and Q transmit (TX) local oscillator (LO) signals from a TX LO signal generator 722 through mixers 720(1), 720(2) to provide an upconverted signal 724. A filter 726 filters the upconverted signal 724 to remove undesired signals caused by the frequency upconversion and noise in a receive frequency band. A power amplifier (PA) 728 amplifies the upconverted signal 724 from the filter 726 to obtain the desired output power level and provides a transmit RF signal. The transmit RF signal is routed through a duplexer or switch 730 and transmitted via an antenna 732.

In the receive path, the antenna 732 receives signals transmitted by base stations and provides a received RF signal, which is routed through the duplexer or switch 730 and provided to a low noise amplifier (LNA) 734. The duplexer or switch 730 is designed to operate with a specific receive (RX)-to-TX duplexer frequency separation, such that RX signals are isolated from TX signals. The received RF signal is amplified by the LNA 734 and filtered by a filter 736 to obtain a desired RF input signal. Downconversion mixers 738(1), 738(2) mix the output of the filter 736 with I and Q RX LO signals (i.e., LO_I and LO_Q) from an RX LO signal generator 740 to generate I and Q baseband signals. The I and Q baseband signals are amplified by AMPs 742(1), 742(2) and further filtered by lowpass filters 744(1), 744(2) to obtain I and Q analog input signals, which are provided to the data processor 706. In this example, the data processor 706 includes analog-to-digital converters (ADCs) 746(1), 746(2) for converting the analog input signals into digital signals to be further processed by the data processor 706.

In the wireless communications device 700 of FIG. 7, the TX LO signal generator 722 generates the I and Q TX LO signals used for frequency upconversion, while the RX LO signal generator 740 generates the I and Q RX LO signals used for frequency downconversion. Each LO signal is a periodic signal with a particular fundamental frequency. A TX phase-locked loop (PLL) circuit 748 receives timing information from the data processor 706 and generates a control signal used to adjust the frequency and/or phase of the TX LO signals from the TX LO signal generator 722. Similarly, an RX PLL circuit 750 receives timing information from the data processor 706 and generates a control signal used to adjust the frequency and/or phase of the RX LO signals from the RX LO signal generator 740.

Figure 8:
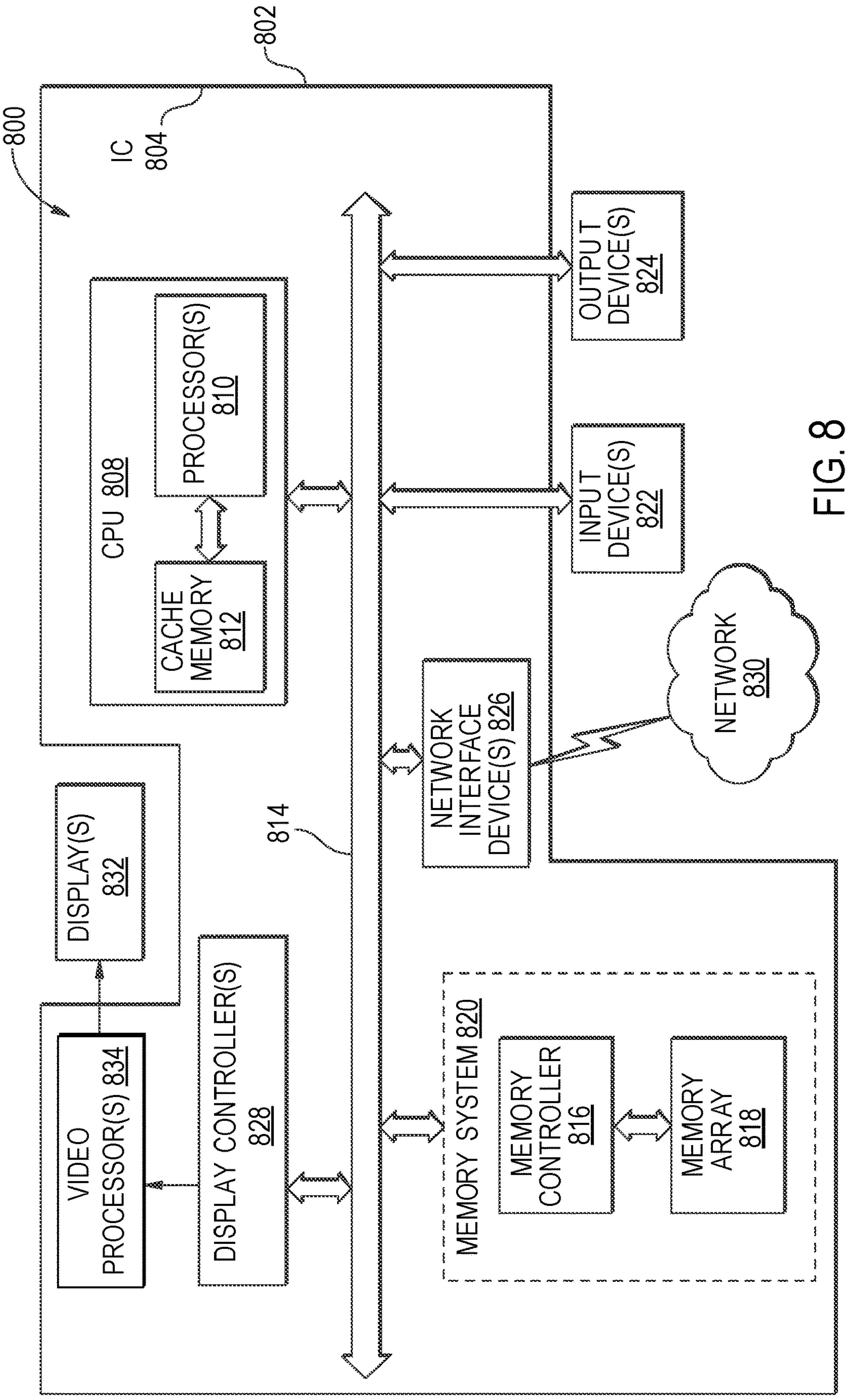
FIG. 8 is a block diagram of an exemplary wireless communication device that includes radio-frequency (RF) components that can include an exemplary transistor circuit on an exemplary IC die that may be included in a video headset, including an XR device secured to a frontal portion of a harness and cooled by a fluid-based cooling system including a thermal control mechanism secured in a rear portion of the harness, as illustrated in FIGS. 2A, 2B, 6A, and 6B that may operate according to, but not limited to, the exemplary method of cooling in the flowchart in FIG. 3.

FIG. 8 illustrates a block diagram of an example of a processor-based system 800 that may be included in the video headsets 200 and 600 in FIGS. 2A, 2B, 6A, and 6B, which include a fluid-based cooling system 204 configured to cause a fluid 218 to flow through an XR device 202, a thermal control mechanism 206, and a harness 214 in a closed loop. In this example, the processor-based system 800 includes a processor 802 that includes an IC 804, including one or more central processor units (CPUs) 808, which may also be referred to as CPU or processor cores, each including one or more processors 810. The CPU(s) 808 may have cache memory 812 coupled to the processor(s) 802 for rapid access to temporarily stored data. The CPU(s) 808 is coupled to a system bus 814 and can intercouple master and slave devices included in the processor-based system 800. As is well known, the CPU(s) 808 communicates with these other devices by exchanging address, control, and data information over the system bus 814. For example, the CPU(s) 808 can communicate bus transaction requests to a memory controller 816 as an example of a slave device. Although not illustrated in FIG. 8, multiple system buses 814 could be provided wherein each system bus 814 constitutes a different fabric.

Other master and slave devices can be connected to the system bus 814. As illustrated in FIG. 8, these devices can include a memory system 820 that includes the memory controller 816 and one or more memory arrays 818, one or more input devices 822, one or more output devices 824, one or more network interface devices 826, and one or more display controllers 828, as examples. The input device(s) 822 can include any type of input device, including, but not limited to, input keys, switches, voice processors, etc. The output device(s) 824 can include any type of output device, including, but not limited to, audio, video, other visual indicators, etc. The network interface device(s) 826 can be any device configured to allow an exchange of data to and from a network 830. The network 830 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 826 can be configured to support any type of communications protocol desired.

The CPU(s) 808 may also be configured to access the display controller(s) 828 over the system bus 814 to control information sent to one or more displays 832. The display controller(s) 828 sends information to the display(s) 832 to be displayed via one or more video processors 834, which process the information to be displayed into a format suitable for the display(s) 832. The display(s) 832 can include any type of display, including, but not limited to, a cathode ray tube (CRT), a liquid crystal display (LCD), a plasma display, or a light-emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium wherein any such instructions are executed by a processor or other processing device, or combinations of both. As examples, the devices and components described herein may be employed in any circuit, hardware component, integrated circuit (IC), or IC chip. Memory disclosed herein may be any type and size of memory and may be configured to store any desired information. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware and may reside, for example, in Random Access Memory (RAM), flash memory, Read-Only Memory (ROM), Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. Alternatively, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications, as will be readily apparent to one of skill in the art. Those of skill in the art will also understand that information and signals may be represented using various technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

Implementation examples are described in the following numbered clauses:

1. A video headset, comprising:
   an extended reality (XR) device comprising:
      a housing; and
      a video display and electronic circuits disposed in the housing,
      wherein the electronic circuits are configured to control the video display;
   a thermal control mechanism;
   a harness configured to be worn by a user and comprising a frontal portion and a rear portion; and
   a fluid-based cooling system comprising a closed loop conduit extending through the XR device, the harness, and the thermal control mechanism,
   wherein:
      the XR device is secured in the frontal portion of the harness; and
      the thermal control mechanism is secured in the rear portion and configured to dissipate heat transferred from the XR device through the closed loop conduit.

2. The video headset of clause 1, the goggle assembly further comprising a first heat exchange apparatus thermally coupled to the electronic circuits and in contact with the fluid in the XR device and configured to transfer heat from the electronic circuits to the fluid.

3. The video headset of clause 2, the first heat exchange apparatus comprising a heat transfer plate, wherein the electronic circuits are thermally coupled to a first side of a wall of the heat transfer plate, and the fluid is in contact with a second side of the wall of the heat transfer plate.

4. The video headset of any of clause 1 to clause 3, wherein the thermal control mechanism is configured to transfer heat from the fluid to environmental air adjacent to the rear portion of the harness.

5. The video headset of any of clause 1 to clause 4, the thermal control mechanism comprising a second heat exchanger, comprising at least one fin configured to be in thermal contact with the fluid and with environmental air adjacent to the thermal control mechanism.

6. The video headset of clause 5, the thermal control mechanism further comprising an air-moving device configured to force air across the at least one fin.

7. The video headset of any of clause 1 to clause 6, the closed loop conduit comprising:
   a first fluid channel extending along a first side of the harness between the XR device and the thermal control mechanism; and
   a second fluid channel extending along a second side of the harness between the XR device and the thermal control mechanism.

8. The video headset of any of clause 1 to clause 7, the closed loop conduit further to transfer fluid heated in the goggle assembly to the thermal control mechanism in the first fluid channel and transfer fluid cooled in the thermal control mechanism back to the goggle assembly in the second fluid channel.

9. The video headset of any of clause 1 to clause 7, the closed loop conduit further comprising a third fluid channel extending between the XR device and the thermal control mechanism and between the first side and the second side of the harness, wherein the closed loop conduit is further configured to:
   transfer fluid heated in the XR device to the thermal control mechanism through the third fluid channel; and
   transfer fluid cooled in the thermal control mechanism to the XR device through the first fluid channel and the second fluid channel.

10. The video headset of any of clause 7 to clause 9, the closed loop conduit further comprising a third fluid channel extending between the XR device and the thermal control mechanism and between the first side and the second side of the harness, wherein the closed loop conduit is further configured to:
   transfer fluid heated in the XR device to the thermal control mechanism through the first fluid channel and the second fluid channel; and
   transfer fluid cooled in the thermal control mechanism to the XR device through the third fluid channel.

11. The video headset of clause 1, the fluid-based cooling system further comprising a two-phase cooling system, wherein fluid heated in the XR device changes phase from a liquid to a gas and fluid cooled in the thermal control mechanism changes phase from the gas to the liquid.

12. The video headset of clause 7, the fluid-based cooling system further comprising a valve disposed in one of the first fluid channel and the second fluid channel and configured to control a rate of fluid flow through the closed loop conduit.

13. The video headset of clause 12, the fluid-based cooling system further comprising a thermal sensor configured to control the valve based on at least one of a temperature of the electronic circuits and a surface temperature of the XR device.

14. The video headset of clause 13, the fluid-based cooling system configured to dissipate a configurable percentage of heat generated in the goggle assembly to environmental air from the thermal control mechanism.

15. The video headset of any of clause 1 to clause 14, the fluid-based cooling system configured to dissipate more heat generated in the XR device to environmental air from the thermal control mechanism than is dissipated to the environmental air from the XR device.

16. The video headset of any of clause 1 to clause 15, wherein the XR device does not include an active air-moving device.

17. A method of cooling a video headset, comprising:
   moving a fluid through a closed loop conduit extending through:
      an extended reality (XR) device comprising a video display and electronic circuits disposed in a housing;
      a thermal control mechanism configured to dissipate heat from the fluid; and
      a harness comprising a frontal portion configured to secure the XR device and a rear portion configured to secure thermal control mechanism.

18. The method of clause 17, further comprising, in the thermal control mechanism, transferring heat from the fluid to environmental air adjacent to rear portion of the harness.

19. The method of clause 17 or clause 18, wherein moving the fluid through the closed loop conduit further comprises:
   moving the fluid away from the XR device through a first fluid channel along a first side of the harness and to the thermal control mechanism; and
   moving the fluid away from the thermal control mechanism through a second fluid channel in the harness on a second side of the head of the user and back to the XR device.

20. A method in a video headset, comprising:
   generating heat in electronic circuits in an extended reality (XR) device comprising a video display;

securing the goggle assembly on a frontal portion of a harness and securing a thermal control mechanism on a rear portion of the harness;

moving a fluid in a closed loop conduit through the XR device, the harness, and the thermal control mechanism; and dissipating, by the thermal control mechanism, heat from the fluid to environmental air adjacent to the thermal control mechanism.

What is claimed is:

1. A video headset, comprising:

an extended reality (XR) device comprising:

a housing; and a video display and electronic circuits disposed in the housing, wherein the electronic circuits are configured to control the video display;

a thermal control mechanism;

a harness configured to be worn by a user and comprising a frontal portion and a rear portion; and a fluid-based cooling system comprising a closed loop conduit extending through the XR device, the harness, and the thermal control mechanism, wherein:

the XR device is secured in the frontal portion of the harness; and the thermal control mechanism is secured in the rear portion and configured to dissipate heat transferred from the XR device through the closed loop conduit.

2. The video headset of claim 1, the XR device, further comprising a first heat exchange apparatus thermally coupled to the electronic circuits and in contact with a fluid in the XR device and configured to transfer heat from the electronic circuits to the fluid.

3. The video headset of claim 2, the first heat exchange apparatus comprising a heat transfer plate, wherein the electronic circuits are thermally coupled to a first side of a wall of the heat transfer plate, and the fluid is in contact with a second side of the wall of the heat transfer plate.

4. The video headset of claim 1, wherein the thermal control mechanism is configured to transfer heat from a fluid to environmental air adjacent to the rear portion of the harness.

5. The video headset of claim 1, the thermal control mechanism comprising a heat exchanger, comprising at least one fin configured to be in thermal contact with a fluid and with environmental air adjacent to the thermal control mechanism.

6. The video headset of claim 5, the thermal control mechanism further comprising an air-moving device configured to force air across the at least one fin.

7. The video headset of claim 1, the closed loop conduit comprising:

a first fluid channel extending along a first side of the harness between the XR device and the thermal control mechanism; and a second fluid channel extending along a second side of the harness between the XR device and the thermal control mechanism.

8. The video headset of claim 7, the closed loop conduit further configured to transfer fluid heated in the XR device to the thermal control mechanism in the first fluid channel and transfer fluid cooled in the thermal control mechanism back to the XR device in the second fluid channel.

9. The video headset of claim 7, the closed loop conduit further comprising a third fluid channel extending between the XR device and the thermal control mechanism and between the first side and the second side of the harness, wherein the closed loop conduit is further configured to:

transfer fluid heated in the XR device to the thermal control mechanism through the third fluid channel; and transfer fluid cooled in the thermal control mechanism to the XR device through the first fluid channel and the second fluid channel.

10. The video headset of claim 7, the closed loop conduit further comprising a third fluid channel extending between the XR device and the thermal control mechanism and between the first side and the second side of the harness, wherein the closed loop conduit is further configured to:

transfer fluid heated in the XR device to the thermal control mechanism through the first fluid channel and the second fluid channel; and transfer fluid cooled in the thermal control mechanism to the XR device through the third fluid channel.

11. The video headset of claim 1, the fluid-based cooling system further comprising a two-phase cooling system, wherein fluid heated in the XR device changes phase from a liquid to a gas, and fluid cooled in the thermal control mechanism changes phase from the gas to the liquid.

12. The video headset of claim 7, the fluid-based cooling system further comprising a valve disposed in one of the first fluid channel and the second fluid channel and configured to control a rate of fluid flow through the closed loop conduit.

13. The video headset of claim 12, the fluid-based cooling system further comprising a thermal sensor configured to control the valve based on at least one of a temperature of the electronic circuits and a surface temperature of the XR device.

14. The video headset of claim 13, the fluid-based cooling system configured to dissipate a configurable percentage of heat generated in the XR device to environmental air from the thermal control mechanism.

15. The video headset of claim 1, the fluid-based cooling system configured to dissipate more heat generated in the XR device to environmental air from the thermal control mechanism than is dissipated to the environmental air from the XR device.

16. The video headset of claim 14, wherein the XR device does not include an active air-moving device.

17. A method of cooling a video headset, comprising:

moving a fluid through a closed loop conduit extending through:

an extended reality (XR) device comprising a video display and electronic circuits disposed in a housing;

a thermal control mechanism configured to dissipate heat from the fluid; and a harness comprising a frontal portion configured to secure the XR device and a rear portion configured to secure the thermal control mechanism.

18. The method of claim 17, further comprising, in the thermal control mechanism, transferring heat from the fluid to environmental air adjacent to the rear portion of the harness.

19. The method of claim 17, wherein moving the fluid through the closed loop conduit further comprises:

moving the fluid away from the XR device through a first fluid channel along a first side of the harness and to the thermal control mechanism; and moving the fluid away from the thermal control mechanism through a second fluid channel on a the second side of the harness and back to the XR device.

20. A method in a video headset, comprising:

generating heat in electronic circuits in an extended reality (XR) device comprising a video display;

securing the XR device on a frontal portion of a harness and securing a thermal control mechanism on a rear portion of the harness;

moving a fluid in a closed loop conduit through the XR device, the harness, and the thermal control mechanism; and dissipating, by the thermal control mechanism, heat from the fluid to environmental air adjacent to the thermal control mechanism.

* * * * *